United States Patent
Chen

(10) Patent No.: US 6,640,883 B2
(45) Date of Patent: Nov. 4, 2003

(54) COMPUTER HEAT SINK

(75) Inventor: Yang-Shiau Chen, Taipei (TW)

(73) Assignee: Glacialtech Inc., Junghe (TW)

( * ) Notice: Subject to any disclaimer, the term of this patent is extended or adjusted under 35 U.S.C. 154(b) by 0 days.

(21) Appl. No.: 10/073,920

(22) Filed: Feb. 14, 2002

(65) Prior Publication Data

US 2003/0150596 A1 Aug. 14, 2003

(51) Int. Cl.$^7$ .................................................. F28F 7/00
(52) U.S. Cl. ...................... 165/80.3; 165/121; 165/185; 361/697; 257/722; 174/16.3
(58) Field of Search ........................ 165/80.3, 121–125, 165/185, 104.33, 908; 361/697; 257/722; 174/16.3

(56) References Cited

U.S. PATENT DOCUMENTS

| | | | | |
|---|---|---|---|---|
| 3,212,569 A | * | 10/1965 | McAdam | 165/80.3 |
| 3,394,387 A | * | 7/1968 | Williams | 165/80.3 |
| 5,943,209 A | * | 8/1999 | Liu | 165/185 |
| 6,053,240 A | * | 4/2000 | Johnston et al. | 165/80.3 |
| 6,069,794 A | * | 5/2000 | Chuang | 165/80.3 |
| 6,112,378 A | * | 9/2000 | Lee | 165/80.3 |
| 6,152,214 A | * | 11/2000 | Wagner | 165/80.3 |
| 6,377,458 B1 | * | 4/2002 | Morris et al. | 165/908 |
| 6,404,634 B1 | * | 6/2002 | Mann | 165/80.3 |

FOREIGN PATENT DOCUMENTS

| | | | | |
|---|---|---|---|---|
| FR | 1257412 | * | 2/1961 | 165/80.3 |
| GB | 0768103 | * | 2/1957 | 165/80.3 |

* cited by examiner

Primary Examiner—Christopher Atkinson
(74) Attorney, Agent, or Firm—Bacon & Thomas

(57) ABSTRACT

A computer heat sink, it especially suits heat sinking of various chip sets or processors which may generate high temperature during running, and has the effect of better efficiency of heat sinking and inexpensiveness of production. It includes many heat sinking fins on the periphery of a base which has centrally a receiving space for fixing a fan, when the air flow generated during running of the fan passes through the gaps among the fins, heat exchanging is induced between the air and the fins to effect heat sinking, The heat sink is characterized by that, each of a plurality of mutually neighboring pairs of heat sinking fins have a difference in the distances of their tops from the center of the base to thereby enlarge the gap therebetween, a peripheral top edge of each heat sinking fin and a line orthogonal to a diametrical line of the base extending through the heat sinking fin have therebetween an included slant angle denoting horizontal slanting of the heat sinking fin, thereby, air flowing through the gaps flows fast by guiding of the included slant angles, and the efficiency of heat sinking is increased.

5 Claims, 8 Drawing Sheets

(C)

(A)

COMPUTER HEAT SINK

BACKGROUND OF THE INVENTION

1. Field of the Invention

The present invention is related to a computer heat sink, and especially to heat sinking of various chip sets or processors (such as a chip set on a computer VGA card and a CPU) which may generate high temperature during running. The present invention has the feature and effect of better efficiency of heat sinking and inexpensiveness of production.

2. Description of the Prior Art

As is well known, computer chip sets or processors may generate high temperature during running, the faster the speed of running is, the higher the number of watt of the driving power will be, and the temperature generated will be higher too; if the temperature of a computer chip set or a processor is too high, operation of the computer will be influenced to make the computer down. Therefore, if the problem of heat sinking can not be solved, running speeds of chip sets or processors will be limited, thereby, the chip sets or the processors are unable to get higher speed.

A conventional heat sink for computers as shown in FIG. 1 has a main structure, wherein, a plurality of heat sinking fins 2 extending upwardly and arranged mutually separately are provided at the periphery on an aluminum base 1 on the top of a chip set or a processor, a fan 3 is provided centrally on the top of the base 1 which absorb the heat from the chip set or the processor and transmit it to the heat sinking fins 2, and the fan 3 drives air to make the air flow through gaps among the heat sinking fins 2 to dissipate heat and thereby to lower the temperature on the chip set or the processor.

The base 1 and the heat sinking fins 2 of the conventional heat sink for computers are made of aluminum and are processed by extruding (A) and then processed by cutting (B), they are complicated in processing, and are wasteful in utilizing of material; the amount of the heat sinking fins 2 is limited by the processing condition of the extruding (A) of the material aluminum, and thereby the heat sinking areas of them are small too.

As shown in FIG. 2, a second conventional heat sink for computers depicted therein is also processed by extruding (A) and then processed by cutting, the difference of it from the conventional heat sink for computers as shown in FIG. 1 is that, the heat sinking fins 2 therein are curved in order to increase the effect of circulation of air. However, the conventional heat sink for computers still has the defects of complication in processing, material wasting and limitation of the amount of the heat sinking fins 2.

As shown in FIG. 3, a third conventional heat sink for computers depicted therein is processed by forming a base 1 and a plurality of heat sinking fins 2 by punching pressing from an aluminum plate (C), the heat sinking fins 2 are then bent upwardly to complete forming of the heat sinking fins 2 upright standing on the base 1. Such conventional heat sink for computers can avoid waste of material, it has a defect that the inner sides of the heat sinking fins 2 form an upright stopping surface though, such that air can not fast flow through the gaps among the heat sinking fins 2, hence its effect of heat sinking is not desired.

As shown in FIG. 4, a fourth conventional heat sink for computers is similar to the third conventional heat sink for computers except that the gaps among the heat sinking fins 2 of it are not formed by cutting part of the material; rather, they are formed by some pairs of the heat sinking fins 2, in each pair of the heat sinking fins 2, the distance of one fin from the base 1 is different from that of the other one, the amount of the heat sinking fins 2 is increased as compared to those shown in FIG. 3, but the defect that air can not fast flow through the gaps among the heat sinking fins 2 still remains.

In view of the above statement, the inventor of the present invention provides the present invention with higher heat sinking effect for computers based on his professional experience of years in designing and manufacturing various heat sinks and after continuous study on the defects to be improved of the conventional heat sinks.

SUMMARY OF THE INVENTION

Particularly, the present invention provides many heat sinking fins extending upwardly and arranged separately on the periphery of a base, a fan is fixedly provided centrally in a receiving space of the base, and the fan drives air to make the air flow through gaps among the heat sinking fins to make heat exchange between the heat sinking fins and the air and thereby to effect heat sinking. The present invention is characterized by: each of a plurality of mutually neighboring pairs of heat sinking fins are different in the distances of their tops from the center of the base to thereby enlarge the gap therebetween, a peripheral top edge of each heat sinking fin and a line orthogonal to a diametrical line of the base extending through the heat sinking fin have therebetween an included slant angle denoting horizontal slanting of the heat sinking fin, thereby, air flowing through the gaps among the heat sinking fins can flow fast therethrough by guiding of the slant angles, and the efficiency of heat sinking can thus be increased.

The primary object of the present invention is: with the above stated feature, when the fan blows air, by the difference of positions between each of a plurality of mutually neighboring pairs of heat sinking fins, and by the slant angles between the peripheral top edge of each heat sinking fin and a line orthogonal to a diametrical line of the base extending through the heat sinking fin, air flowing through the gaps among the heat sinking fins can flow fast therethrough, and the efficiency of heat sinking can be increased.

The secondary object of the present invention is: forming of the heat sinking fins and the base includes: making a sheet from aluminum in the first place, and many heat sinking fins being formed into a radiation form by punching cutting on the periphery of the sheet, then the heat sinking fins being all bent upwardly also by punching pressing, this process has the advantages of convenience of processing and lower cost.

Another object of the present invention is: the above stated slant angles can be simply obtained by twisting the heat sinking fins to make an angular difference between the top and the bottom ends of each heat sinking fin.

A further object of the present invention is: when in practicing, the lateral sides of the heat sinking fins can be processed by punching pressing to render the lateral sides to be elongated toward both ends and gradually thinner also toward both ends thereof, this can not only increase the areas of heat sinking, but also is helpful to guiding of the convective air, thereby, air flow can be faster.

The present invention will be apparent by the persons skilled in the art after reading the detailed description of the preferred embodiment thereof in reference to the accompanying drawings.

DETAILED DESCRIPTION OF THE PREFERRED EMBODIMENT

Figure 1:
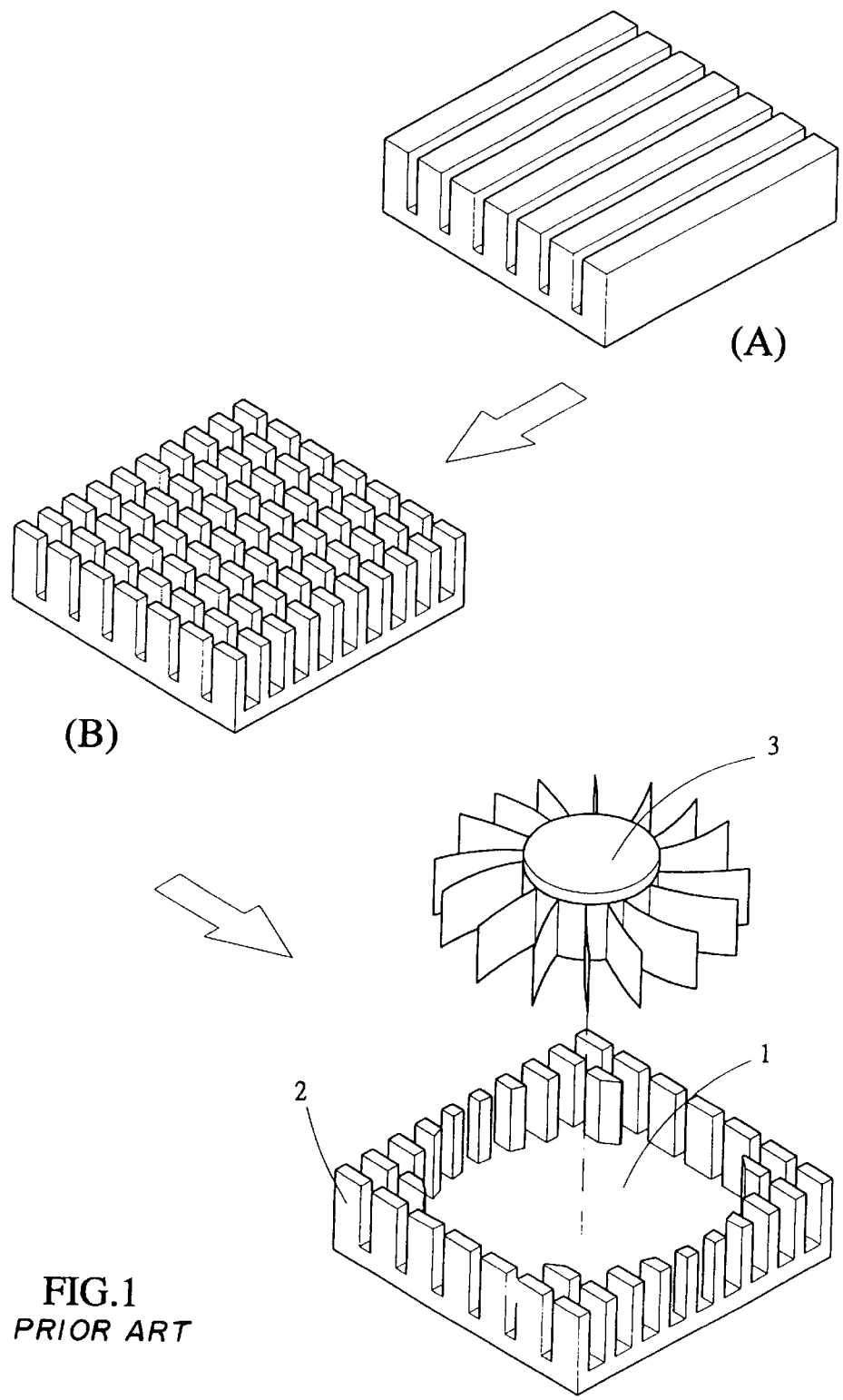
FIG. 1 is a schematic perspective view showing the process of fabrication of a conventional heat sink.
Figure 2:
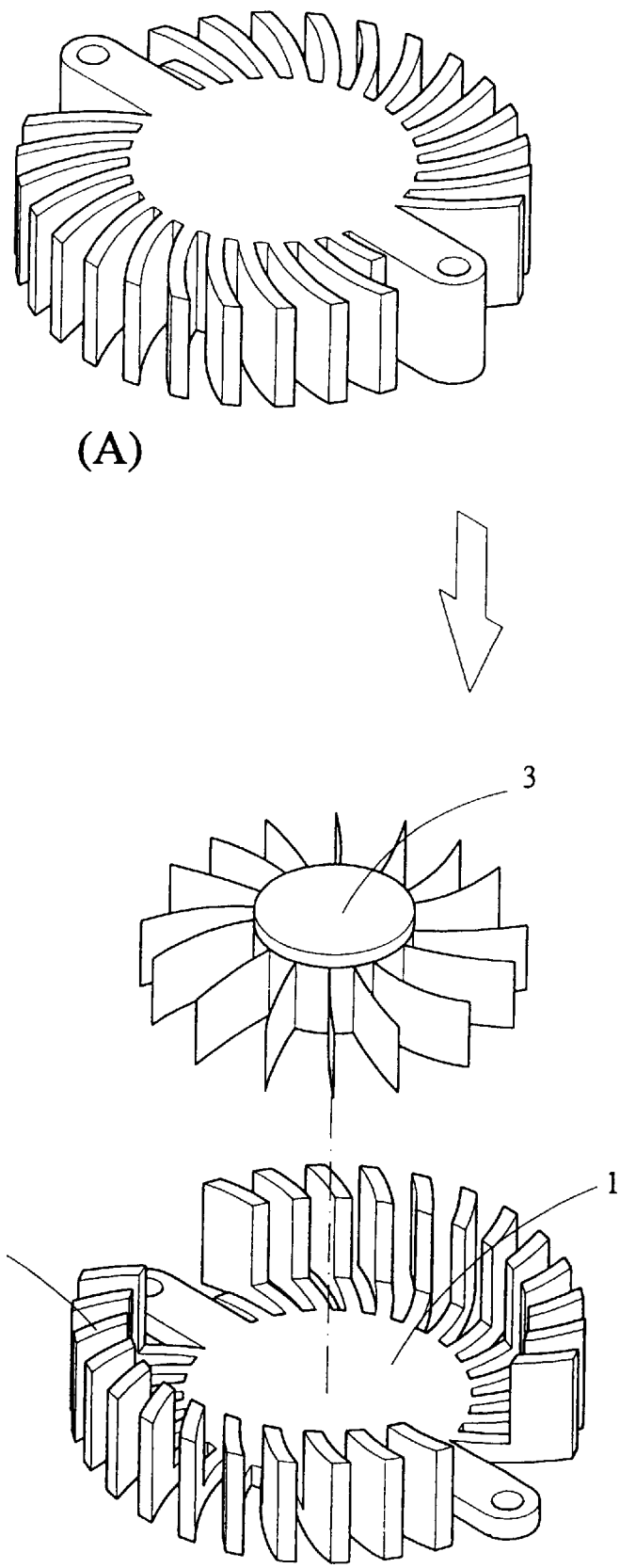
FIG. 2 is a schematic perspective view showing another process of fabrication of a conventional heat sink.
Figure 3:
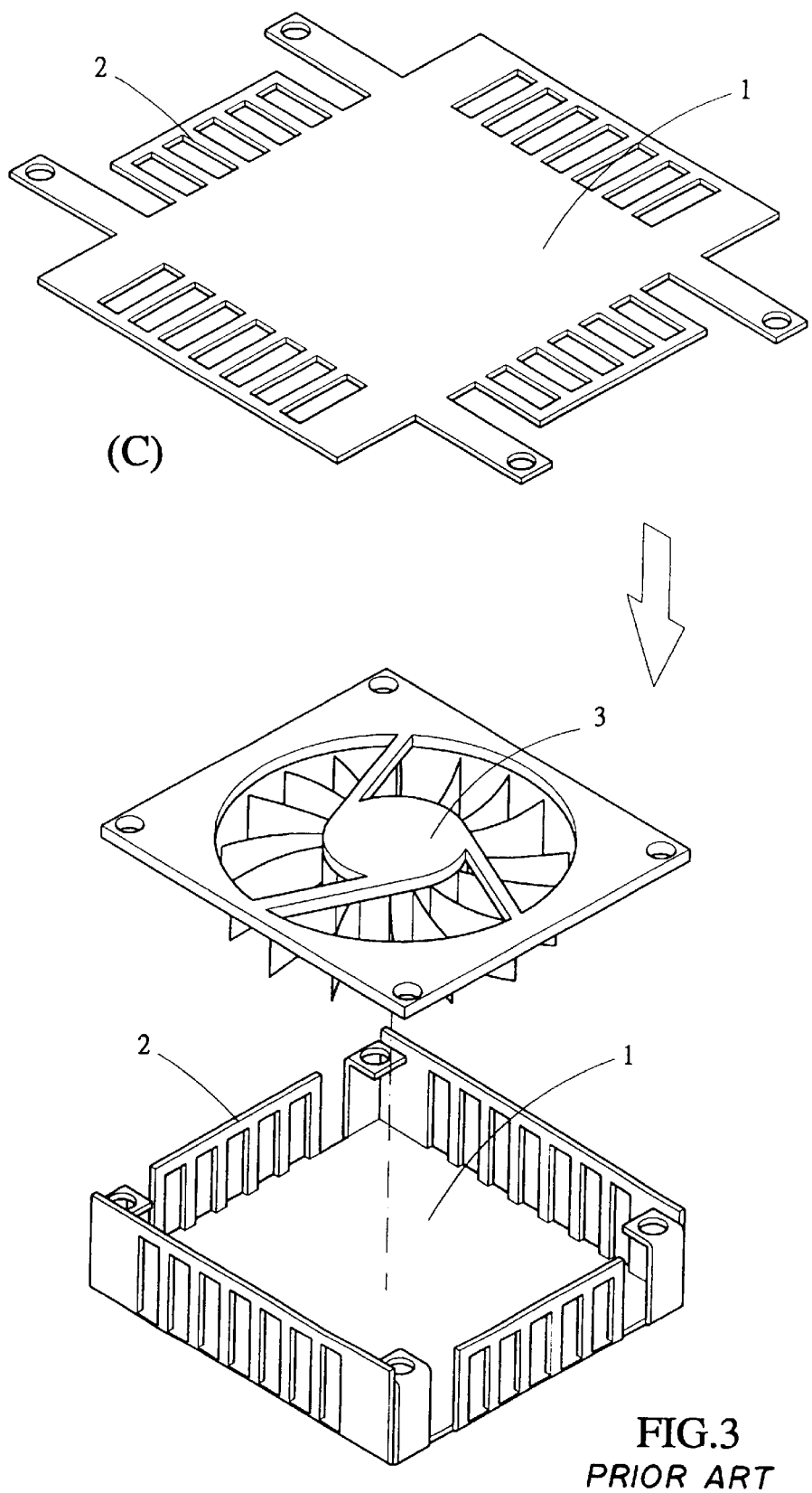
FIG. 3 is a schematic perspective view showing a further process of fabrication of a conventional heat sink.
Figure 4:
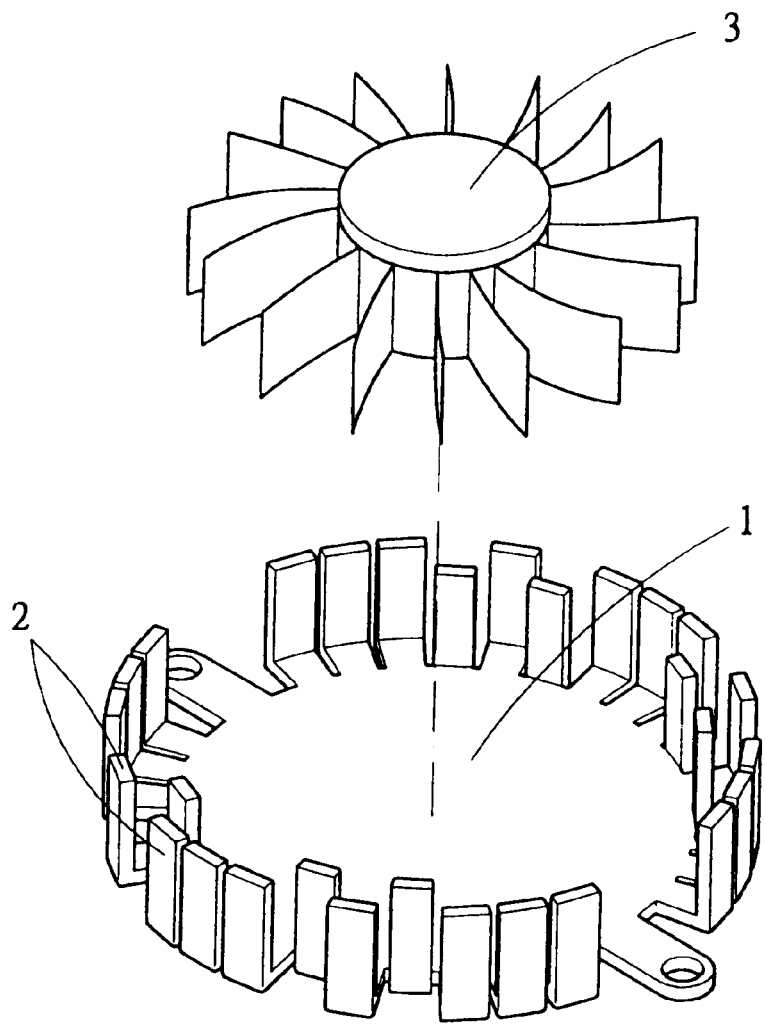
FIG. 4 is an analytic perspective view of a conventional heat sink.
Figure 5:
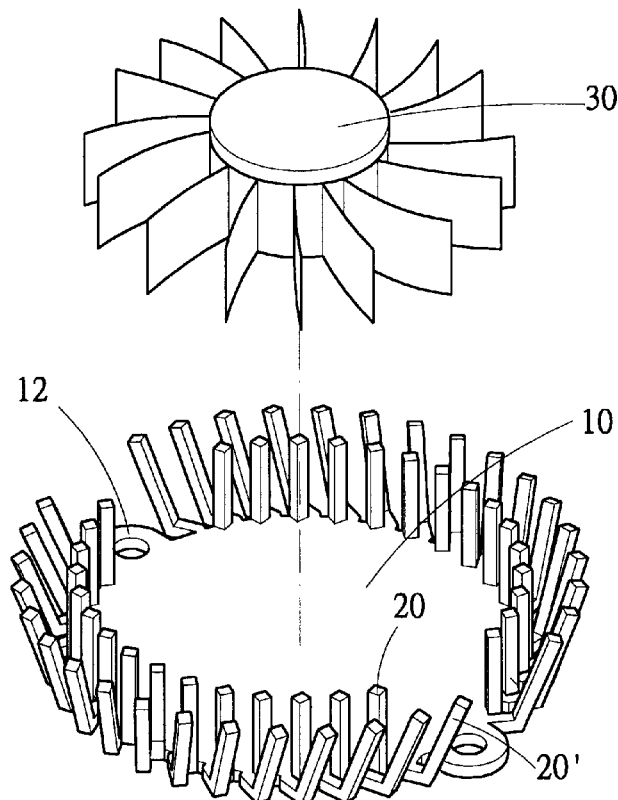
FIG. 5 is an analytic perspective view showing mounting of a fan of the present invention.
Figure 6:
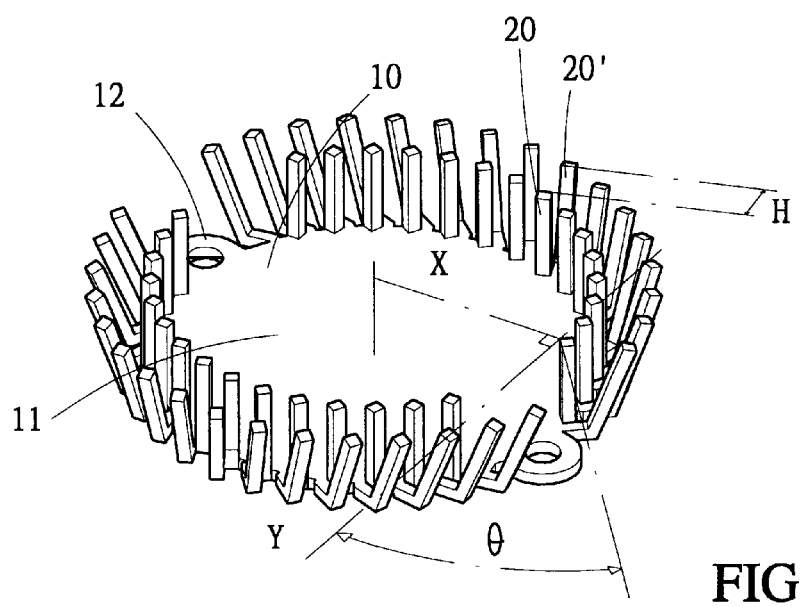
FIG. 6 is a perspective schematic view showing relative positions between the base and many heat sinking fins of the present invention.

Referring to FIGS. 5 and 6, the computer heat sink of the present invention mainly includes many heat sinking fins 20, 20' on the periphery of a base 10, the base 10 has centrally a receiving space 11 for fixing a fan 30. When the air flow generated during running of the fan 30 passes through the gaps among the heat sinking fins 20, 20', heat exchanging is induced between the air and the heat sinking fins 20, 20' to effect heat sinking. The present invention is characterized by that, each of a plurality of mutually neighboring pairs of heat sinking fins 20, 20' have a difference "H" in the distances of their tops from the center of the base 10 to thereby enlarge the gap therebetween, a peripheral top edge of each heat sinking fin 20 (20') and a line "Y" orthogonal to a diametrical line "X" of the base 10 extending through the heat sinking fin 20 (20') have therebetween an included slant angle "θ" denoting horizontal slanting of the heat sinking fin 20 (20'), thereby, air flowing through the gaps among the heat sinking fins 20, 20' can flow fast therethrough by guiding of the slant angles "θ", and the efficiency of heat sinking can thus be increased.

Figure 7:
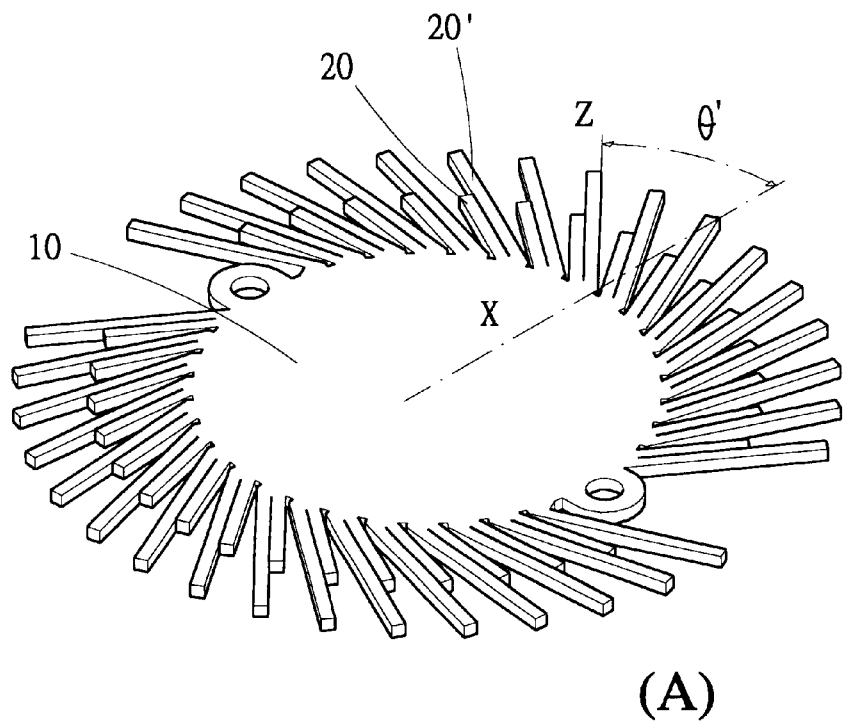
FIG. 7 is a perspective schematic view showing processing for making the present invention.
Figure 7:
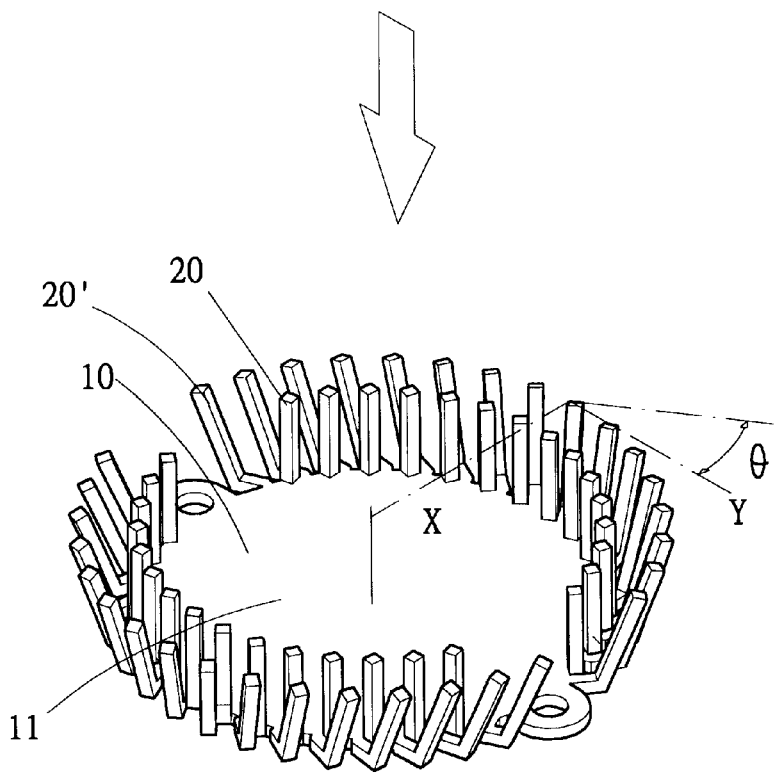

Referring to FIG. 7, the above stated heat sinking fins 20, 20' can be integrally formed with the base 10, forming of the heat sinking fins 20, 20' and the base 10 includes: making a sheet "A" from an aluminum plate in the first place, and many heat sinking fins 20, 20' being formed into a radiation form by punching cutting on the periphery of the sheet "A", then the heat sinking fins 20, 20' being all bent upwardly also by punching pressing. In this way, the peripheral top edges of the heat sinking fins 20, 20' each can be in the direction to get an included slant angle "θ" stated above denoting horizontal slanting of the heat sinking fin 20 (20'), the base 10 is formed at the central portion of the sheet "A", the heat sinking fins 20, 20' surround the base 10, thereby, the receiving space 11 is formed on the base 10 by surrounding of the heat sinking fins 20, 20'. When the heat sinking fins 20, 20' are bent upwardly, every neighboring two heat sinking fins 20, 20' can be dealt with using a tool to get a difference "H" in the distances of their tops from the center of the base 10.

Instead of the above stated punching pressing process from an aluminum plate, the structure of the present invention can also be formed by some other feasible method such as integrally pressing molding.

The base 10 can be other than round in practice, for instance, the sheet "A" in the drawings is round, it makes the base 10 round; if the sheet "A" is rectangular, the base 10 must be rectangular too.

Figure 8:
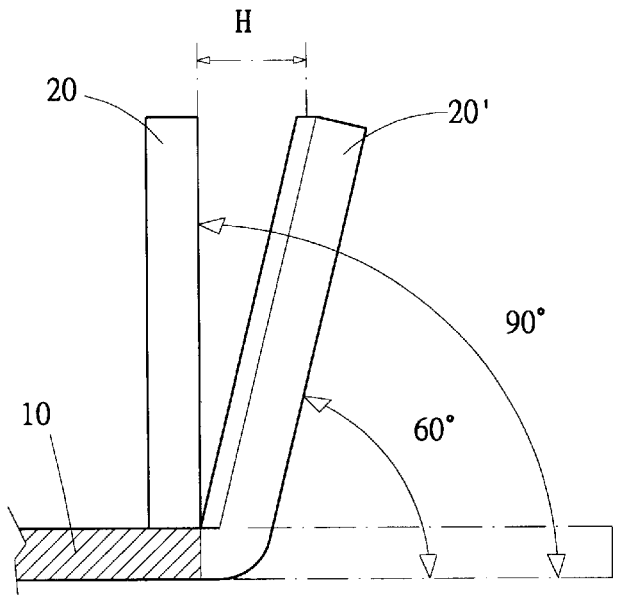
FIG. 8 is a schematic view showing bending of the heat sinking fins of the present invention.

As shown in FIG. 8, the two heat sinking fins 20, 20' therein have a difference "H" in the distances of their tops from the center of the base 10, forming of the difference "H" can be attained during bending of the heat sinking fins 20, 20. For example, when in bending, the first heat sinking fin 20 is bent upwardly to a 90 degree vertical position, while the neighboring heat sinking fin 20' is bent upwardly for only 60 degrees, by the difference of angles of altitude, the two heat sinking fins 20, 20' get the difference "H" in the distances of their tops respectively from the center of the base 10.

The peripheral top edges of the two heat sinking fins 20, 20' and a line "Y" orthogonal to a diametrical line "X" of the base 10 extending through the heat sinking fin 20 (20') have therebetween an included slant angle "θ", forming of the included slant angle "θ" is shown in FIG. 7. When in punching cutting to form the heat sinking fins 20, 20', each pair of mutually neighboring heat sinking fins 20, 20' have an edge "Z" after cutting thereof formed an included slant angle "θ" with a diametrical line "X" of the base 10 extending through the bottom of the edge. And thereby, after bending upwardly, a peripheral top edge of each heat sinking fin 20 (20') and a line "Y" orthogonal to a diametrical line "X" of the base 10 extending through the heat sinking fin 20 (20') have therebetween the above mentioned included slant angle "θ" denoting horizontal slanting of the heat sinking fin 20 (20').

Figure 9:
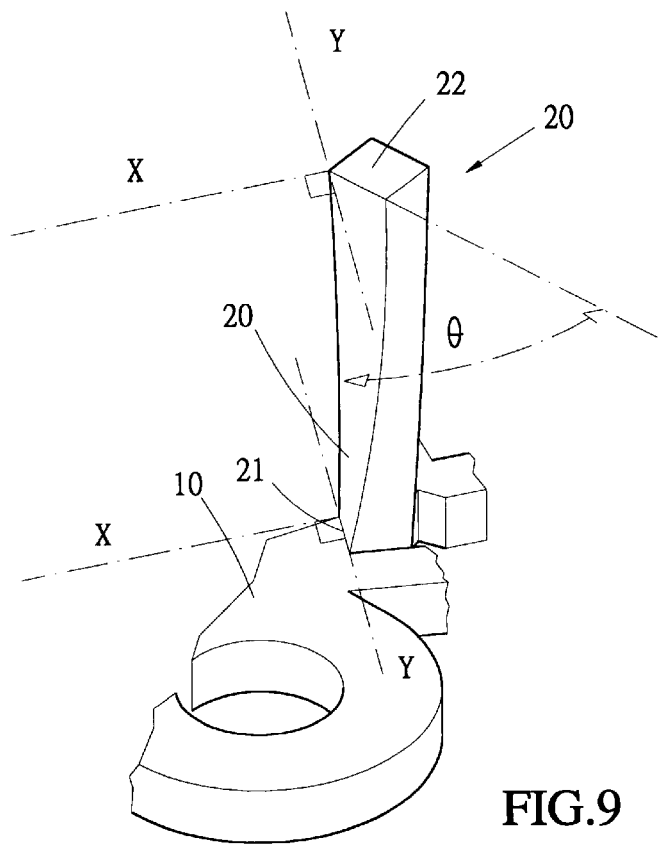
FIG. 9 is a perspective schematic view showing twisting of a heat sinking fin of the present invention.

As shown in FIG. 9, the abovementioned included slant angle "θ" can also be formed by twisting of a heat sinking fin 20 (20'). Taking one heat sinking fin 20 as an example, the bottom 21 of the heat sinking fin 20 is parallel to the line "Y" orthogonal to the diametrical line "X" of the base 10 extending through the heat sinking fin 20. And after twisting of the top of the heat sinking fin 20, there is an angular difference between the top end 22 and the bottom end 21 of the heat sinking fin 20, and this angular difference is exactly the aforesaid slant angle "9".

Figure 10:
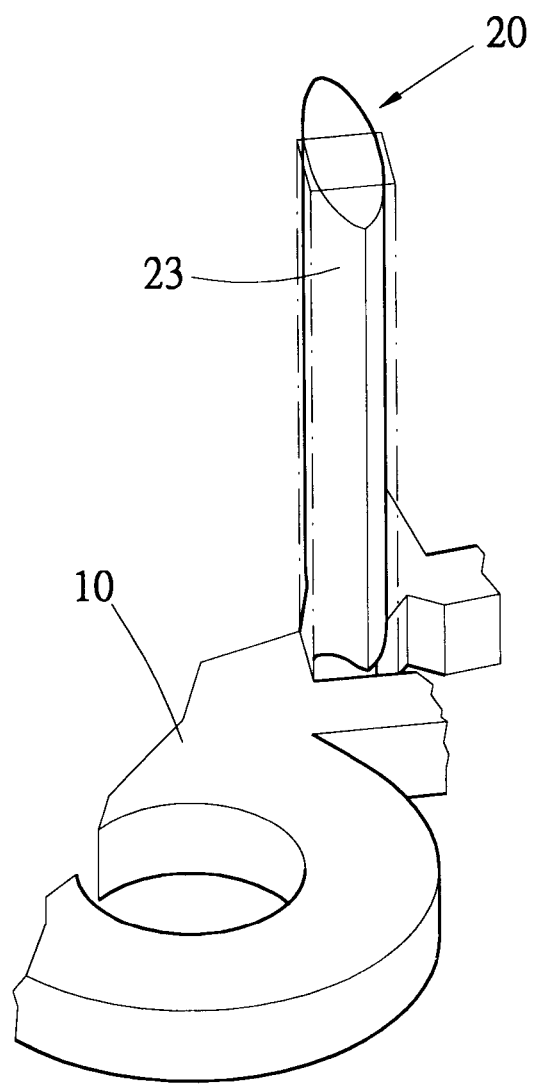
FIG. 10 is a perspective schematic view showing forming guide surfaces on the lateral sides of a heat sinking fin of the present invention.

In the above statement, in order to speed up the air flow through the gaps between two mutually neighboring heat sinking fins 20, 20' (FIG. 6) to increase the effect of heat sinking, the heat sinking fins 20, 20' are processed to have their slant angles "θ" stated above to form a guiding action for the air. In practicing, the heat sinking fins 20, 20' can be elongated toward both ends and gradually thinner also toward both ends thereof, thereby, a better air guiding action can be obtained. For example, as shown in FIG. 10, a heat sinking fin 20 is shown with its lateral sides getting gradually thinner toward both ends thereof, thereby, the lateral sides of the heat sinking fin 20 form slant guide surfaces, so that a better guiding action for the flowing air can be obtained. And the thickness of the heat sinking fin 20 along the lateral sides gets gradually smaller toward both ends of the sides, this can be formed by punching pressing to have the original heat sinking fin 20 with uniform thickness punching pressed on the lateral sides thereof, thereby, the lateral sides of the heat sinking fin 20 get elongated toward both ends and gradually get thinner also toward both ends thereof. Now, the heat sinking fin 20 has in addition to obtaining a better guiding action for the flowing air, it has the areas of the elongated lateral sides increased to enhance heat sinking, heat exchange of the heat sinking fin 20 with air can be faster, and the effect of heat sinking can thus be raised.

As shown in FIG. 5, in practicing of the present invention, the base 10 can be provided on two mutually opposite lateral positions thereof with two connecting holes 12, so that the base 10 can be fixed on an article to be heat sunk (a chip set or a processor).

The names of the members composing the present invention are only for illustrating a preferred embodiment but not for giving any limitation to the scope of the present invention. Various modifications or changes can be made to the present invention without departing from the spirit and scope thereof, all such modifications and changes are intended to form part of this invention.

What is claimed is:

1. A computer heat sink including a plurality of heat sink fins on the periphery of a base and with gaps between said fins, said base having a receiving space centrally located for fixing a fan which generates an air flow through the gaps among said heat sink fins to induce heat exchange between the air and the heat sink fins to effect heat transfer; wherein said heat sink is characterized in that each of a plurality of mutually neighboring pairs of heat sink fins have a difference in the distances of their tops from the center of said base, a peripheral top edge of each of said heat sink fins and a line orthogonal to a diametrical line of said base extending through said heat sinking fin have therebetween an included slant angle denoting horizontal slanting of said heat sink fin thereby increasing air flowing through said gaps among said heat sink fins by said included slant angles to increase the efficiency of heat sink; with the proviso that said each pair of heat sink fins are bent upwardly from said base to different angles of altitude to obtain said difference in the distances of said tops of said heat sinking fins from the center of said base.

2. A computer heat sink according to claim 1, wherein said heat sink fins are integrally formed with said base.

3. A computer heat sink according to claim 1, wherein said heat sink fins are twisted to make an angular difference between the top and the bottom ends of each of said heat sink fins to thereby form said included slant angle.

4. A computer heat sink according to claim 1, wherein the lateral sides of said heat sink fins are gradually thinner, thereby said lateral sides of said heat sinking fins form slant glide surfaces.

5. A computer heat sink according to claim 1, wherein said base is provided at two mutually opposite lateral positions thereon with two connecting holes for fixing on an article to be heat sunk.

* * * * *